(12) United States Patent
Candelier et al.

(10) Patent No.: US 7,504,683 B2
(45) Date of Patent: Mar. 17, 2009

(54) INTEGRATED ELECTRONIC CIRCUIT INCORPORATING A CAPACITOR

(75) Inventors: Philippe Candelier, Saint Mury (FR); Thierry Devoivre, Gieres (FR); Emmanuel Josse, La Motte Servolex (FR); Sébastien Lefebvre, Villard-Bonnot (FR)

(73) Assignees: STMicroelectronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 92 days.

(21) Appl. No.: 11/600,584

(22) Filed: Nov. 15, 2006

(65) Prior Publication Data
US 2007/0114596 A1 May 24, 2007

(30) Foreign Application Priority Data
Nov. 21, 2005 (FR) ................................ 05 11775

(51) Int. Cl.
*H01L 29/94* (2006.01)
(52) U.S. Cl. .................. 257/296; 257/298; 257/300; 257/E29.345
(58) Field of Classification Search .............. 257/296, 257/298, 300, E29.345
See application file for complete search history.

(56) References Cited
U.S. PATENT DOCUMENTS
5,465,249 A * 11/1995 Cooper et al. ............. 365/149

| | | | |
|---|---|---|---|
| 5,909,049 A | 6/1999 | McCollum | |
| 6,096,580 A | 8/2000 | Iyer et al. | |
| 6,421,293 B1 | 7/2002 | Candelier et al. | |
| 2002/0094611 A1 | 7/2002 | Wu et al. | |
| 2004/0227209 A1 | 11/2004 | Radens et al. | |

OTHER PUBLICATIONS

Patent Abstracts of Japan, JP 59103367, published Jun. 14, 1984.
Candelier, et al., "One Time Programmable Drift Antifuse Cell Reliability," cite unknown, date believed to be 1997.
S.P. Klepner, "One-Device Storage Cell with Implanted Storage Node," IBM Technical Disclosure Bulletin, vol. 19, No. 2 dated Jul. 1976; XP 002006864.

* cited by examiner

*Primary Examiner*—Evan Pert
*Assistant Examiner*—Tan N Tran
(74) *Attorney, Agent, or Firm*—Gardere Wynne Sewell LLP

(57) ABSTRACT

A non-volatile memory element includes a transistor for selecting the element and a capacitor for recording a binary value by electrical breakdown of an insulating layer (13) of the capacitor. A structure of the memory element is modified in order to allow a higher degree of integration of the element within an electronic circuit of the MOS type. In addition, the memory element is made more robust with respect to a high electrical voltage (VDD) used for recording the binary value. The transistor includes a drain in the substrate with electric field drift in a longitudinal direction extending towards the capacitor. The electric field drift region for the drain includes a first extension underneath the gate of the transistor opposite the source and a second extension underneath the insulating layer of the capacitor. Doping of the substrate for the electric field drift region is limited to a region substantially corresponding to a distance between the gate and an electrode of the capacitor.

26 Claims, 1 Drawing Sheet

INTEGRATED ELECTRONIC CIRCUIT INCORPORATING A CAPACITOR

PRIORITY CLAIM

The present application claims priority from French Patent Application No. 05 11775 filed Nov. 21, 2005, the disclosure of which is hereby incorporated by reference.

BACKGROUND OF THE INVENTION

1. Technical Field of the Invention

The present invention relates to a non-volatile memory element, and also to a fabrication process for such a memory element.

2. Description of Related Art

A known technique is to fabricate a non-volatile memory element in the form of an integrated electronic circuit of the MOS (for Metal-Oxide-Semiconductor) type, in which a value of one bit is recorded by electrical breakdown of an insulating layer of a capacitor. The binary value is then stored permanently. Such non-volatile memory elements are useful, for example, for repairing static or dynamic random access memories having high storage capacities.

The binary value 1 is recorded in such a non-volatile memory element by selecting the memory element by means of a gate voltage of an MOS transistor connected in series with the capacitor. A high electrical voltage, of around 7 V (volts), is then applied between power supply terminals of the element, so as to cause the breakdown of the insulating layer of the capacitor . The capacitor thus becomes electrically conducting. Such an operation is sometimes referred to as 'antifuse'.

During a later operation for reading the binary value stored in the non-volatile memory element, the memory element is supplied with a voltage of around 2.5 V, in accordance with the normal power supply standards for integrated circuits of the MOS type. The memory element is again selected by the gate voltage of the transistor connected to the capacitor, and the conducting or insulating state of the capacitor is detected in order to read the binary value stored.

In order to obtain low-cost non-volatile memory elements, these are fabricated according to the normal fabrication processes for integrated circuits of the MOS type, which are designed to operate with a power supply voltage of around 2.5 V. The structure of the transistor connected to the capacitor of each non-volatile memory element then needs to be designed so that this transistor is not damaged by the high electrical voltage used to record a binary value equal to 1.

For this purpose, U.S. Pat. No. 6,421,293 (EP 1,014,447) discloses a non-volatile memory element, using CMOS technology, in which the transistor of the memory element comprises a drain region with electric field drift. Such a transistor is widely denoted as a 'drift-MOSFET' transistor. It allows a high electrical voltage to be applied to the memory element for recording the binary value 1, without damaging the transistor. The reason for this is that part of the high electrical voltage is consumed in the drain region by ohmic resistive effect, after the breakdown of the insulating layer of the capacitor.

However, in a memory element such as is disclosed in aforementioned patent, the drift-field drain region of the transistor and the capacitor are formed within an n-doped well. In addition, this well comprises an electrical isolation region of the STI (for Shallow Trench Isolation) type. The design rules that are necessarily used for the formation of a doping well impose that alignment margins be adhered to, notably because of the implementation of lithographic process steps. The non-volatile memory element then occupies a portion of surface of an integrated electronic circuit substrate that is significant, typically of around 10 $\mu m^2$ (square micrometers). It is not therefore possible to substantially increase the integration level of the non-volatile memory element, for example in order to reduce its cost price.

A need accordingly exists for a non-volatile memory element that may be fabricated using MOS technology and that is compatible with a high level of integration.

SUMMARY OF THE INVENTION

To address the foregoing need, a non-volatile memory element for the storage of one bit comprises a capacitor for recording a value of the bit by electrical breakdown of an insulating layer of the capacitor and a transistor for selecting this element. The transistor and the capacitor are formed within an active region of an integrated electronic circuit substrate. The transistor is of the field-effect MOS type. The transistor incorporates a source region designed to be connected to a first power supply terminal for the memory element, a gate designed to be connected to a selection terminal for the memory element, and a drain region with electric field drift in a longitudinal direction. The capacitor incorporates the insulating layer, which is disposed on top of a surface of the substrate, a first electrode, which is disposed on the insulating layer and which is designed to be connected to a second power supply terminal for the memory element, and a second electrode. This second electrode comprises a first portion of the substrate that is situated under the insulating layer and within the extension of the drain region of the transistor on a side opposite to the gate. According to an embodiment, the drift-field drain region comprises a second portion of the substrate within the active region, whose doping is limited to an interval substantially corresponding to a distance between the gate of the transistor and the first electrode parallel to the longitudinal direction.

Given that the gate of the transistor and the first electrode of the capacitor are two structures in relief above the surface of the substrate, they can be used to bound the second portion of the substrate in which the doping of the drain region is effected. Such a doping can be carried out by scanning the surface of the substrate with a dopant species implantation beam. During the scanning, the portion of the substrate into which the dopant species penetrate is bounded by the structures in relief of the gate of the transistor and of the first electrode of the capacitor. These structures in relief stop the dopant species of the beam before they reach the surface of the substrate. In the jargon of those skilled in the art, the drift-field drain region is said to be self-aligned relative to the gate of the transistor and to the capacitor. Such a self-alignment allows alignment margins to be eliminated and the level of integration of the non-volatile memory element to be increased. In particular, a non-volatile memory element according to the invention can occupy a part of the substrate surface that is less than 7 $\mu m^2$, or even less than 3 $\mu m^2$.

Such a doping with self-alignment, which is used to form the drift-field drain region, is advantageously carried out at the same time as the doping of extensions of source and of drain regions of MOS transistors of an integrated electronic circuit incorporating the non-volatile memory element. Such extensions are portions of the substrate that are situated underneath lateral sides of MOS gate structures, at the ends of the associated channels. They are usually referred to as LLDs, for Lightly Doped Drains.

Preferably, the first electrode and the insulating layer of the capacitor can have a MOS transistor gate structure. They can then be formed at the same time as the gates of MOS transistors of the circuit, and notably at the same time as the gate of the transistor of the memory element itself, which reduces the number of steps required for the fabrication of the non-volatile memory element.

The robustness of a non-volatile memory element according to the invention, during the recording of the binary value 1 using a power supply voltage of around 7 V, or during later read operations of the stored binary value, may be further improved by using one or more of the following additional features:

- the second portion of the substrate, which corresponds to drift-field drain region, may have a concentration of n-type dopant species of around $5 \times 10^{18}$ cm$^{-3}$ (per cubic centimeter), over at least one part of the length of this second portion in the longitudinal direction;
- the first portion of the substrate, which corresponds to the second electrode of the capacitor, may have a concentration of n-type dopant species of around $5 \times 10^{17}$ cm$^{-3}$ within at least one part of the latter;
- the transistor may comprise a gate isolation layer that has a thickness greater than or equal to the thickness of the insulating layer of the capacitor, these thicknesses being measured in a direction perpendicular to the surface of the substrate;
- the transistor may comprise a gate isolation layer that has a thickness greater than the thickness of the insulating layer of the capacitor, and the second portion of the substrate, which corresponds to the drift-field drain region, can have an identical doping, over at least one part of the length of this portion in the longitudinal direction, to that of an extension under the gate of the transistor of a third portion of the substrate corresponding to the source region of the transistor;
- the substrate can comprise a fourth doped portion situated on one side of the first portion corresponding to the second electrode of the capacitor, which is opposite to the second portion of the substrate corresponding to the drift-field drain region, this fourth portion having an extension under the insulating layer of the capacitor that has a doping identical to that of the said second portion of the substrate;
- the fourth portion of the substrate can have a doping identical to that of the third portion of the substrate which corresponds to the source region of the transistor; and
- the capacitor can be composed of several oblong capacitor sections disposed on the surface of the substrate.

Some of these improvements contribute to reducing the electrical resistance of the capacitor which is apparent during the reading of the binary value 1, after the insulating layer of the latter has been subject to electrical breakdown. Heating of the memory element caused by this electrical resistance is therefore reduced. In addition, the memory element exhibits an enhanced read contrast between the binary values 0 and 1.

In addition, all these improvements can be obtained by adapting lithographic masks already used in the fabrication of an integrated electronic circuit of the MOS type. The additional cost of fabrication of an integrated electronic circuit which is generated by the formation, within this circuit, of a non-volatile memory element according to the invention and/or according to these improvements is therefore small.

The invention also provides a process for the fabrication of a non-volatile memory element of the preceding type within an integrated electronic circuit. According to this process, the second portion of the substrate, which corresponds to the drift-field drain region, is determined, during a doping step for this second portion, by self-alignment with respect to the gate of the transistor and to the first electrode of the capacitor parallel to the longitudinal direction.

The second portion of the substrate, corresponding to the drift-field drain region, could optionally be doped at the same time as extensions of source and of drain regions of MOS transistors contained in the circuit. In this way, the fabrication of a non-volatile memory element according to the invention does not require the addition of specific process steps with respect to the MOS fabrication process for an integrated electronic circuit.

Moreover, the fabrication of a non-volatile memory element according to the invention may furthermore be combined with the MOS process according to the following improvements, taken separately or in combination:

- the first electrode and the insulating layer of the capacitor can be formed at the same time as gates and gate isolation layers of MOS transistors contained within the circuit;
- a part of the first portion of the substrate, which corresponds to the second electrode of the capacitor, can be doped at the same time as portions of the substrate that are designed to form the channels of MOS transistors contained in the circuit, for adjusting a threshold voltage of these transistors;
- the second portion of the substrate, which corresponds to the drift-field drain region, can be doped at the same time as extensions of source and of drain regions of MOS transistors contained in the circuit, and which have respective gate isolation layers that are thicker than the insulating layer of the capacitor;
- the fourth portion of the substrate, which is situated on the side of the first portion corresponding to the second electrode of the capacitor opposite to the second portion of the substrate corresponding to the drift-field drain region, can have an extension under the insulating layer of the capacitor, which is doped at the same time as the second portion of the substrate;
- the fourth portion of the substrate can be doped at the same time as source and drain regions of MOS transistors contained in the circuit; and
- portions of a silicide material can be formed on the first electrode of the capacitor, on the gate and on the source region of the transistor, by using a resin mask that covers the substrate at least within a region extending between this first electrode and this gate. Such a step for the formation of portions of silicide on the contact regions of the circuit already exists in the MOS circuit fabrication process, and the improvement of the invention considered here resides in the design of the mask used for this step.

Lastly, an embodiment of the invention relates to an integrated electronic circuit that comprises a non-volatile memory element such as is described hereinabove. This circuit can be a random access memory array, and the non-volatile memory element can be designed to allow a recovery programming of the random access memory array. Such a programming operation can allow, for example, defective parts of the random access memory array to be neutralized and/or to be functionally replaced by other parts that are available and intended for this purpose.

In accordance with an embodiment, an integrated electronic circuit comprises a non-volatile memory element comprising a MOS transistor having a source in a substrate, a gate and a drain in the substrate with electric field drift in a longitudinal direction. The circuit further comprises a capacitor having a first electrode is arranged on an insulating layer and a second electrode comprising a first portion of the substrate located under the insulating layer and aligned with the drain in the longitudinal direction. The electric field drift of the drain is formed in a second portion of the substrate adjacent the first portion and extending along the longitudinal direction from a first extension underneath the gate of the transistor opposite the source to a second extension underneath the insulating layer of the capacitor.

BRIEF DESCRIPTION OF THE DRAWINGS

Other characteristics and advantages of the invention will become further apparent on reading the description which follows. The latter is purely illustrative and should be read in conjunction with the appended drawings, in which.

DETAILED DESCRIPTION OF THE DRAWINGS

For reasons of clarity, the dimensions of the elements shown in these figures are not in proportion with their real dimensions or dimension ratios. Two directions, longitudinal and transverse, of the memory element are respectively denoted as L and T and are parallel to a surface S of a substantially planar integrated electronic circuit substrate used for fabricating the memory element. N is a direction perpendicular to the surface S and oriented upwards in FIG. 1. The terms 'on', 'under', 'lower' and 'upper' are used in the following description with reference to this orientation. In addition, identical references in the two figures denote identical elements.

Finally, the following will be limited to the description of a succession of elementary fabrication steps for an integrated electronic circuit of the MOS type, which allows the invention to be reproduced. Each elementary step, which is considered to be known per se, is not described in detail.

Figure 1:
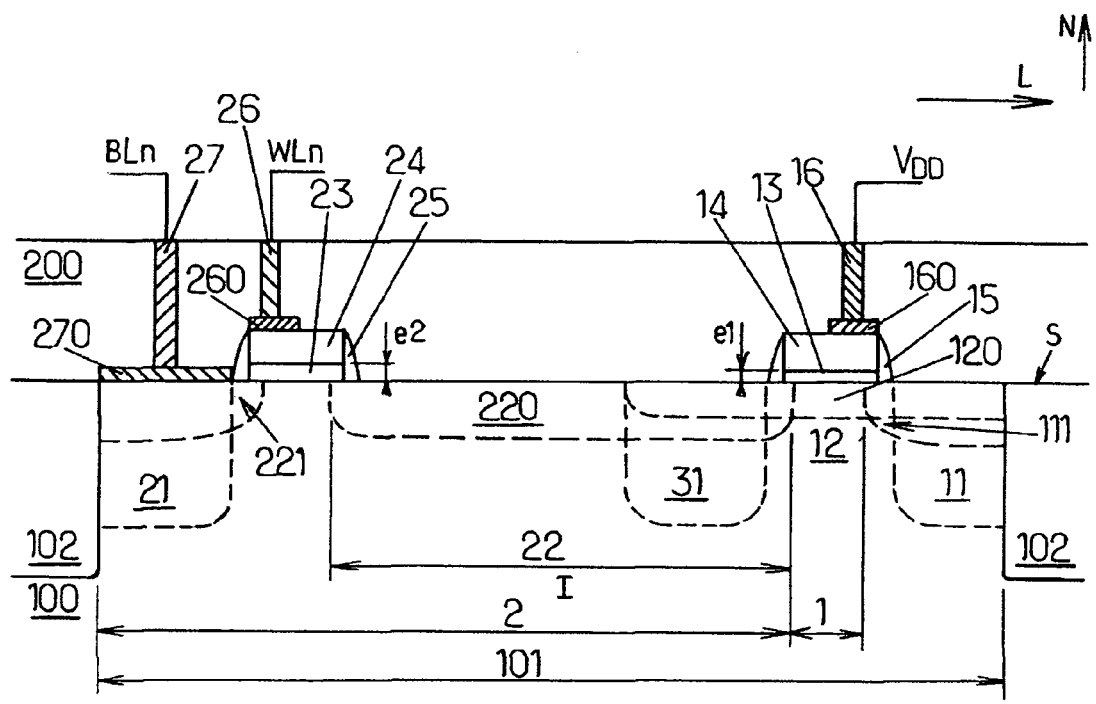
FIG. 1 is a cross-sectional view of a non-volatile memory element according to the invention.

The integrated electronic circuit substrate that is used for the fabrication of the non-volatile memory element, referenced 100 in FIG. 1, is a P-type single-crystal silicon substrate. The substrate is resistive, having an electrical resistivity of around 10 to 15 Ω.cm (Ohm.centimetres) such as is widely used in 90 nm (nanometer) CMOS technology. It is recalled that MOS technologies that have appeared successively are characterized by the pitch of the lithographic masks used. Generally speaking, this pitch corresponds to the width of the gates of the MOS transistors that are fabricated according to these technologies. By way of comparison with the concentrations of dopant species that are mentioned below, the substrate 100 has a concentration of dopant species of the p type of around $10^{15}$ cm$^{-3}$.

A ring of electrical isolation 102 is formed in the substrate 100 from the surface S. Such a ring can be, for example, of the STI (for Shallow Trench Isolation) type. It surrounds a portion of the substrate 100 that will contain the memory element. The region of the circuit corresponding to this useful portion of the substrate 100 is called active region and is referenced 101. For a non-volatile memory element according to the invention, the surface area of the region 101 can be reduced to 3 μm$^2$ (square microns).

Figure 2:
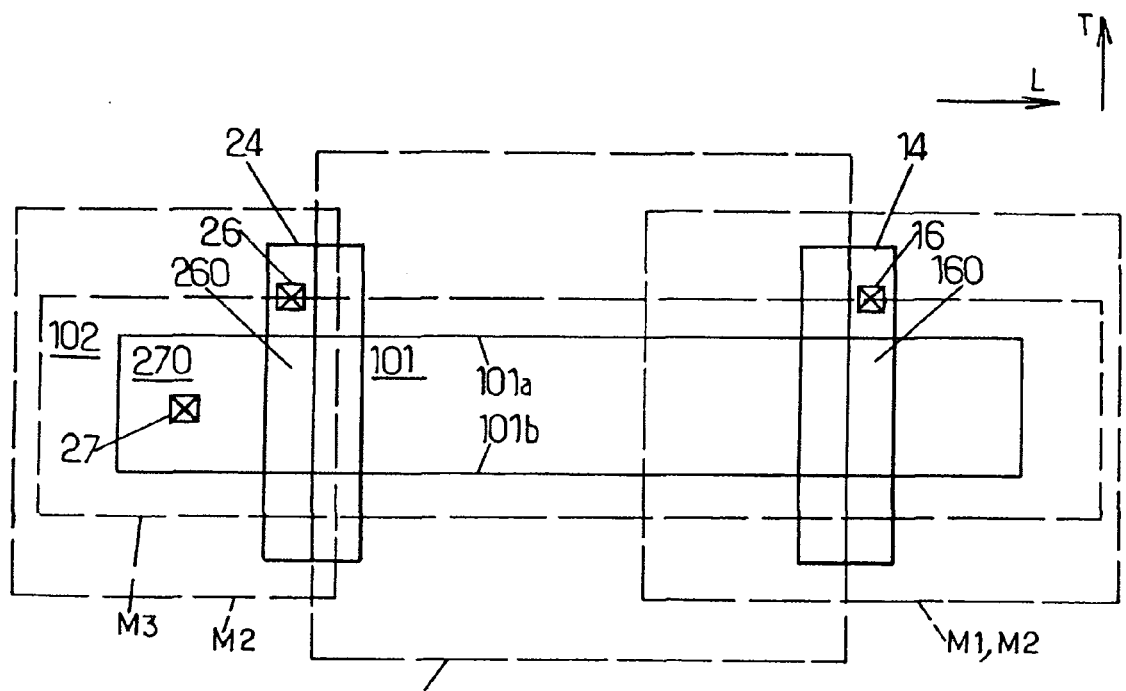
FIG. 2, which is established in correspondence with FIG. 1, is a top view of the non-volatile memory element on which are indicated mask boundaries used for the fabrication of the memory element.

The fabrication process for MOS transistors of an integrated electronic circuit usually comprises a first doping of the n type, which is designed to adjust threshold voltages of the MOS transistors of the circuit. Such a doping is effected at the transistor locations with a low-energy implantation beam, such that the implanted dopant species are confined just below the surface S of the substrate 100. For the non-volatile memory element considered here, such a doping is simultaneously carried out in a portion of the active region 101 which corresponds to the capacitor, referenced 1 in FIG. 1. This portion, referenced 120, is defined by a lithography mask M1 which has an opening at this location (FIG. 2). The concentration of dopant species that is thus produced in the portion 120 is around $5\times10^{17}$ cm$^{-3}$. Such a doping of the portion 120 allows the residual electrical resistance of the capacitor 1, after the insulating layer of the latter has been destroyed in order to record a binary value equal to 1, to be reduced.

Two MOS transistor gate structures are then formed on the surface S in the active region 101. The first of these gate structures comprises an insulating layer 13 overlaid by a conducting portion 14. The layer 13 and the portion 14 are surrounded by an insulating spacer 15, parallel to the surface S. Similarly, the second gate structure comprises an electrical isolation layer 23, a conducting portion 24 and a spacer 25. The layers 13 and 23 can be composed of silica ($SiO_2$), the conducting portions 14 and 24 of polysilicon and the spacers 15 and 25 of silicon nitride ($Si_3N_4$), for example. In a known technique, these two gate structures are advantageously formed simultaneously by using a dedicated lithography mask called a gate mask.

The insulating layer 13 and the conducting portion 14 will form the capacitor 1 of the non-volatile memory element, with a portion 12 of the substrate 100 situated under the insulating layer 13. The portions 12 and 14 form the two electrodes, lower and upper respectively, of the capacitor 1. The conducting portion 24 and the layer 23 will respectively form the gate and the gate isolation layer of the transistor 2 of the non-volatile memory element.

Preferably, the insulating layer 13 of the capacitor 1 has a thickness e1, measured in the direction N, which is less than the thickness e2 of the gate isolation layer 23 of the transistor 2. For example, e1 can be equal to 2.0 nm (nanometers) and e2 can be equal to 2.8 or 5.0 nm. Such a difference between the thicknesses e1 and e2 contributes to preventing the layer 23 from being damaged when a high voltage, for example of 7 V, is applied to the serial combination of the capacitor 1 and of the transistor 2 for recording a binary value equal to 1. Indeed, because of this difference in thickness, the layer 13 is designed to break down electrically before the layer 23.

A second doping of the substrate 100 is then performed in certain portions of the active region 101, referenced 11, 21 and 31. This doping, of the n type, is effected by implantation of dopant species accelerated in the direction N. The concentration of these species that is reached in each of the portions of the substrate 11, 21 and 31 is high, for example of the order of $10^{20}$ cm$^{-3}$. This second doping is also designed to form the source and the drain regions of the MOS transistors of the circuit, other than the transistor 2 of the non-volatile memory element. Consequently, the doping of the portions 11, 21 and 31 does not require additional steps in the circuit fabrication process. It is obtained by adapting the lithography mask used for defining the source and drain regions of the transistors. This mask, referenced M2 in FIG. 2, has two openings in the active region 101: the first opening extends on either side of the portion 14 of the capacitor 1, and the second opening extends from the gate 24, on one side of the latter opposite to the portion 14. In the directions L and T, the two openings of the mask M2 extend towards the outside of the active region 101 at least as far as the inside edges of the insulating portion 102. Overlays of these openings onto the portion 102 are included in order to adhere to the design rules relating to lithography masks.

For this second implantation, the gate structures of the capacitor 1 and of the transistor 2 form masks, such that portions 11, 21 and 31 are self-aligned relative to the upper electrode of the capacitor 1 and to the gate of the transistor 2.

The portion 21 of the substrate 100 which is thus doped forms the source region of the transistor 2.

The portions 11 and 31 are situated on either side of the portion of the substrate 100 that corresponds to the lower electrode 12 of the capacitor 1. The portion 11, which is situated between the capacitor 1 and one edge of the active region 101, is provided in order to avoid an edge of the upper electrode 14 being situated above the insulating portion 102. A weakening of the portion 102 at the surface S, which could cause the non-volatile memory element to age more rapidly, is thus avoided.

The portion 31 forms a part of the drain 22 of the transistor 2. It is situated against the portion 12 and has an extension bounded in the direction of the gate 14. For this purpose, an opaque part of the mask M2, which exists between the two openings of the latter, defines a portion of the substrate 100 within the active region 101 that remains resistive, between the electrode 14 of the capacitor 1 and the gate 24 of the transistor 2. This resistive portion, referenced 220 in FIG. 1, is designed to form an electric field drift region within the drain region 22 of the transistor 2.

A third doping of the substrate 100, again of the n type, is subsequently performed within the whole of the active region 101, using an implantation beam whose energy is lower than that of the implantation beam used for the second doping. The implanted dopant species are now therefore contained within a thin film of the substrate 100, situated under the surface S, which has a smaller thickness than that of the portions 11, 21 and 31. This third implantation is also limited to the uncovered parts of the active region 101, outside of the structures in relief of the electrode 14 of the capacitor 1 and of the gate 24 of the transistor 2. In addition, the beam of dopant particles that is used for this third implantation has a controlled divergence, such that dopant particles are implanted obliquely into the substrate 100 under the edges of the electrode 14 and of the gate 24. An extension 111 of the portion 11 is thus formed, which prolongs the latter under one edge of the insulating layer 13 and of the electrode 14 of the capacitor 1. Similarly, an extension 221 is simultaneously formed, which prolongs the source region 21 under one edge of the insulating layer 23 and of the gate 24. These extensions 111 and 221 have a concentration of dopant species of $5 \times 10^{18}$ cm$^{-3}$. Such a value of concentration is substantially identical to the doping level widely applied for extensions of an MOS (90 nm) transistor, when the thickness of the gate isolation layer is around 2.0 nm. In this way, the doping of the extensions 111 and 221 can be advantageously effected at the same time as that of the extensions of the source and drain regions of the MOS transistors of the circuit which do not belong to the non-volatile memory element.

The portion 220 of the substrate 100 which is situated between the electrode 14 and the gate 24 is simultaneously doped under identical conditions. In particular, it has a concentration of dopant species of the n type that is also about $5 \times 10^{18}$ cm$^{-3}$. The resistivity of the portion 220 is thus adjusted in order to produce a suitable spreading of the electric field present between the electrode 14 and the gate 24. In this way, when a voltage of 7 V is applied between the electrode 14 and the source 21, the current that flows through the memory element is limited by the electrical resistance of the portion 220. A protection for the transistor 1 is thus obtained against any damage to the latter that could be caused by the current that flows through the memory element right after the breakdown of the insulating layer 13.

Thanks to the concentration of electrical carriers that is thus obtained in the portion 220, the quantity of hot carriers generated in the memory element during operation of the latter is reduced, with respect to a situation according to which the portion 220 would be doped at the same time as the MOS transistor source and drain regions. By hot carriers is understood high-energy electrons or holes that flow in the channel of the transistor 2, and which cause ageing of the transistor 2 by progressively degrading the insulating layer 23 and the interface of the latter with the substrate 100.

During the third doping process, a mask M3 can be formed on the circuit for limiting the implantation of the dopant species to the relevant regions of the substrate 100. Given that the active region 101 is subject in its entirety to this implantation, the mask M3 has an opening that comprises the whole of the region 101 (FIG. 2). Thus, the electric field drift region 220 is bounded, by self-alignment, on the one hand by the electrode 14 and by the gate 24 in the direction L, and on the other, by two opposing edges 101a and 101b of the active region 101 in the direction T.

Given that the implantation beam used for this third doping is divergent, dopant species are implanted into the substrate 100 under the edges of the electrode 14 and the gate 24 which bound the portion 220 by self-alignment. The portion 220 therefore has an extension, in the direction L, that corresponds to an interval I slightly larger than the separation distance between the gate 24 and the electrode 14. Nevertheless, the interval I is determined by the respective positions of the gate 24 and of the electrode 14 on the surface S.

The inventors point out that the concentration of dopant species of $5 \times 10^{18}$ cm$^{-3}$ that is produced in the extensions 111, 221 and in the portion 220 corresponds to a concentration value for extensions of an MOS transistor that has a gate thickness of 2.8 to 5.0 nm, for MOS (90 nm) technology. In the embodiment described here, this concentration value is also obtained in the substrate 100 on each side of the electrode 12 of the capacitor 1, even though the thickness e1 of the insulating layer 13 is only 2.0 nm. By way of comparison, for the extensions of a transistor that has a gate isolation layer of 2.0 nm thickness, the concentration of dopant species that is widely used is $5 \times 10^{19}$ cm$^{-3}$.

Electrical contact regions are subsequently formed on the electrode 14, the gate 24 and the source region 21. The known technique of silicidation can be used, which consists in depositing portions of a metal, such as cobalt (Co), titanium (Ti) or nickel (Ni), selectively on the electrode 14, the gate 24 and the source region 21. For this purpose, a silicidation mask M4 is formed on the circuit, which covers the regions of the latter that are not intended to receive metal. According to FIG. 2, the mask M4 covers a central part of the active region 101, included between the electrode 14 and the gate 24 in the direction L. It could also cover the portion 11. A layer of metal is formed on the circuit in the openings of the mask M4. The mask M4 is then dissolved, such that metal only remains on one part of the electrode 14, one part of the gate 24 and on the source region 21. The circuit is then heated in order to cause a chemical reaction between the metal and the silicon material of the portions of the circuit with which the metal is in direct contact. Separate portions 160, 260 and 270 of cobalt, titanium or nickel silicide are thus formed on the electrode 14, the gate 24 and the source region 21, respectively. These portions of silicide are designed to reduce electrical contact resistances appearing when electrical connections are later formed.

The fabrication of the electronic circuit is subsequently continued in a known manner. A layer of silica 200 is formed on the substrate 100 on top of the gate structures and the portions of silicide. Such a layer 200 is called the interconnection layer. In particular, connections 16, 26 and 27 are formed through the layer 200 in order to electrically connect the electrode 14 of the capacitor 1, together with the source region 21 and the gate 24 of the transistor 1, via the portions of silicide 160, 260 and 270, respectively.

According to an improvement of the invention, the capacitor 1 has a shape designed to further reduce its electrical resistance, which is relevant during a read step when the insulating layer 13 is electrically broken down. For this purpose, the capacitor 1 is composed of several oblong capacitor sections, forming for example a serpentine or a comb structure on the surface S, with a reduced width for each section. Typically, the width of at least some of the sections of the capacitor, measured in a direction parallel to the surface S, is less than ten times the length, in this same direction, of an extension of the portion 220 of the substrate under the insulating layer 13. In this way, the electrode 12 of the capacitor 1 exhibits an apparent electrical conduction that is higher than that which would result from threshold voltage adjustment doping of the circuit MOS transistors alone. A reduced amount of heat is then produced within the capacitor during the reading of a binary value equal to 1. Indeed, the distance between the breakdown point of the insulating layer of the capacitor and the drift-field drain region is thus shortened. In addition, this results in a higher read contrast between stored binary values equal to 0 and 1.

A non-volatile memory element such as is described in detail hereinabove is used by linking the connection 26 to a word line WLn and the connection 27 to a bit line BLn.

In order to write the binary value 1 into the non-volatile memory element, the word line WLn and the bit line BLn have respective voltages of 2.5 V and 0 V applied to them. Simultaneously, a voltage VDD of 7 V is applied to the connection 16. The transistor 2 is then turned on, such that an electrical current flows in the capacitor 1, in the portion 220 and the source region 21, which is sufficient to cause electrical breakdown of the insulating layer 13. This current is limited by the ohmic resistance of the portion 220 which corresponds to the electric field drift region. It is limited to an intensity value such that the transistor 2 is not damaged.

In order to later read the value written into the non-volatile memory element, the voltage VDD is set at the nominal operating value of the MOS circuit, in other words 2.5 V. When the memory element is selected in order to read the binary value stored in the latter, potentials of 2.0-2.5 V and 2.5 V are respectively applied to the bit line BL and to the word line WL. The transistor 2 is then turned on and a read current flows in the memory element if the stored binary value is 1. When the memory element is not selected, potentials of 2.5 V and 0 V are respectively applied to the bit line BL and to the word line WL. The transistor 2 is then turned off, such that no read current flows through the memory element.

It will be understood that numerous modifications may be introduced into a non-volatile memory element according to the invention, with respect to the embodiment that has been described in detail, while still conserving at least some of the advantages presented. In particular, the invention may be readily transposed to non-volatile memory elements fabricated according to MOS technologies that correspond to different gate widths.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A non-volatile memory element for the storage of one bit, comprising:
    a capacitor for recording a value of the bit by breakdown of an insulating layer of said capacitor;
    a transistor for selecting said element;
    wherein the transistor and the capacitor are formed within an active region of an integrated electronic circuit substrate,
    wherein the transistor is of the field-effect MOS type incorporating a source region designed to be connected to a first power supply terminal for the memory element, a gate designed to be connected to a selection terminal for the memory element, and a drain region with electric field drift in a longitudinal direction,
    wherein the capacitor insulating layer is arranged on top of a surface of the substrate, a first electrode of the capacitor is arranged on the insulating layer and designed to be connected to a second power supply terminal for the memory element, and a second electrode of the capacitor comprises a first portion of the substrate located under the insulating layer and in line with the drain region of the transistor on a side opposite to the gate,
    wherein the electric field drift drain region comprises a second portion of the substrate within the active region, a doping of said second portion of the substrate being limited to an interval substantially corresponding to a distance between the gate and the first electrode parallel to the longitudinal direction.

2. The non-volatile memory element according to claim 1, wherein the first electrode and the insulating layer of the capacitor have a MOS transistor gate structure.

3. The non-volatile memory element according to claim 1, wherein the second portion of the substrate corresponding to the electric field drift drain region has a concentration of n-type dopant species of around $5 \times 10^{18}$ cm$^{-3}$, over at least part of the length of said second portion in the longitudinal direction.

4. The non-volatile memory element according to claim 1, wherein the first portion of the substrate corresponding to the second electrode of the capacitor has a concentration of n-type dopant species of around $5 \times 10^{17}$ cm$^{-3}$ within at least one part of said first portion.

5. The non-volatile memory element according to claim 1, wherein the transistor comprises a gate isolation layer having a thickness e2 equal to a thickness e1 of the insulating layer of the capacitor, said thicknesses being measured in a direction perpendicular to the surface of the substrate.

6. The non-volatile memory element according to claim 1, wherein the transistor comprises a gate isolation layer having a thickness e2 greater than a thickness e1 of the insulating layer of the capacitor, said thicknesses being measured in a direction perpendicular to the surface of the substrate.

7. The non-volatile memory element according to claim 1, wherein the substrate comprises a fourth portion doped and located on one side of the first portion corresponding to the second electrode of the capacitor opposite to the second portion of the substrate corresponding to the drift-field drain region, an extension of said fourth portion under the insulating layer of the capacitor having a doping identical to the doping of said second portion of the substrate.

8. The non-volatile memory element according to claim 7, wherein said fourth portion of the substrate has a doping identical to the doping of a third portion of the substrate corresponding to the source region of the transistor.

9. The non-volatile memory element according to claim 1, wherein the capacitor is composed of several elongated capacitor sections.

10. The non-volatile memory element according to claim 9, wherein at least some of the capacitor sections have a width, measured in a direction parallel to the surface of the substrate, that is less than ten times the length, in said direction, of an extension of the second portion of the substrate corresponding to the drift-field drain region under the insulating layer of the capacitor.

11. The non-volatile memory element according to claim 1, wherein the element occupies a substrate surface region within an encircling isolation ring having an area of less than 7 $\mu m^2$.

12. A non-volatile memory element for the storage of one bit, comprising:
a capacitor for recording a value of the bit by breakdown of an insulating layer of said capacitor; a transistor for selecting said element;
wherein the transistor and the capacitor are formed within an active region of an integrated electronic circuit substrate,
wherein the transistor is of the field-effect MOS type incorporating a source region designed to be connected to a first power supply terminal for the memory element, a gate designed to be connected to a selection terminal for the memory element, and a drain region with electric field drift in a longitudinal direction,
wherein the capacitor insulating layer is arranged on top of a surface of the substrate, a first electrode of the capacitor is arranged on the insulating layer and designed to be connected to a second power supply terminal for the memory element, and a second electrode of the capacitor comprises a first portion of the substrate located under the insulating layer and in line with the drain region of the transistor on a side opposite to the gate,
wherein the electric field drift drain region comprises a second portion of the substrate within the active region, a doping of said second portion of the substrate being limited to an interval substantially corresponding to a distance between the gate and the first electrode parallel to the longitudinal direction,
wherein the transistor comprises a gate isolation layer having a thickness e2 greater than a thickness e1 of the insulating layer of the capacitor, said thicknesses being measured in a direction perpendicular to the surface of the substrate, and wherein the second portion of the substrate corresponding to the drift-field drain region has an identical doping, over at least part of the length of said second portion in the longitudinal direction, to a doping of an extension under the gate of the transistor of a third portion of the substrate corresponding to the source region of the transistor.

13. A non-volatile memory element for the storage of data, comprising:
an integrated electronic circuit substrate having an active region;
a capacitor formed in the active region, the capacitor including a capacitor insulating layer on top of a surface of the substrate and a first electrode on the insulating layer, wherein the insulating layer is subjected to breakdown to store a data value in the memory element;
a field-effect MOS type transistor incorporating a source region, a gate for connection to a selection terminal for the memory element, and a drain region with electric field drift in a longitudinal direction, the transistor for accessing the capacitor to retrieve the data value;
a first portion of the substrate located under the insulating layer and in line with the drain region of the transistor on a side opposite to the gate forming a second electrode of the capacitor;
wherein the electric field drift drain region comprises a second portion of the substrate within the active region, a doping of said second portion of the substrate being limited to an interval substantially corresponding to a distance between the gate and the first electrode parallel to the longitudinal direction.

14. The non-volatile memory element according to claim 13, wherein the first electrode and the insulating layer of the capacitor have a MOS transistor gate structure.

15. The non-volatile memory element according to claim 13, wherein the second portion of the substrate corresponding to the electric field drift drain region has a concentration of n-type dopant species of around $5\times10^{18}$ cm$^{-3}$, over at least part of the length of said second portion in the longitudinal direction.

16. The non-volatile memory element according to claim 13, wherein the first portion of the substrate corresponding to the second electrode of the capacitor has a concentration of n-type dopant species of around $5\times10^{17}$ cm$^{-3}$ within at least one part of said first portion.

17. The non-volatile memory element according to claim 13, wherein the transistor comprises a gate isolation layer having a thickness e2 equal to a thickness e1 of the insulating layer of the capacitor, said thicknesses being measured in a direction perpendicular to the surface of the substrate.

18. The non-volatile memory element according to claim 13, wherein the transistor comprises a gate isolation layer having a thickness e2 greater than a thickness e1 of the insulating layer of the capacitor, said thicknesses being measured in a direction perpendicular to the surface of the substrate.

19. The non-volatile memory element according to claim 13, wherein the substrate comprises a fourth portion doped and located on one side of the first portion corresponding to the second electrode of the capacitor opposite to the second portion of the substrate corresponding to the drift-field drain region, an extension of said fourth portion under the insulating layer of the capacitor having a doping identical to the doping of said second portion of the substrate.

20. The non-volatile memory element according to claim 19, wherein said fourth portion of the substrate has a doping identical to the doping of a third portion of the substrate corresponding to the source region of the transistor.

21. The non-volatile memory element according to claim 13, wherein the capacitor is composed of several elongated capacitor sections.

22. The non-volatile memory element according to claim 21, wherein at least some of the capacitor sections have a width, measured in a direction parallel to the surface of the substrate, that is less than ten times the length, in said direction, of an extension of the second portion of the substrate corresponding to the drift-field drain region under the insulating layer of the capacitor.

23. The non-volatile memory element according to claim 13, wherein the element occupies a substrate surface region within an encircling isolation ring having an area of less than 7 $\mu m^2$.

24. The non-volatile memory element according to claim 13, wherein second portion of the substrate forms a resistance protecting the transistor from damage during breakdown of the insulating layer of the capacitor to store the data value.

25. The non-volatile memory element according to claim 13, wherein the second portion of the substrate corresponding to the electric field drift of the drain has an identical doping to a doping of the first extension under the gate of the transistor.

26. The non-volatile memory element according to claim 13, wherein the second portion of the substrate corresponding to the electric field drift of the drain has an identical doping to a doping of the second extension under the insulating layer of the capacitor.

* * * * *